United States Patent
Hong et al.

(10) Patent No.: US 8,754,395 B1
(45) Date of Patent: Jun. 17, 2014

(54) SEMICONDUCTOR DEVICE AND METHOD OF MANUFACTURING THE SAME

(71) Applicant: SK hynix Inc., Gyeonggi-do (KR)

(72) Inventors: Young Ok Hong, Gyeonggi-do (KR); Kyoung A Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/830,721

(22) Filed: Mar. 14, 2013

(30) Foreign Application Priority Data

Dec. 4, 2012 (KR) .................. 10-2012-0139755

(51) Int. Cl.
*H01L 29/72* (2006.01)
(52) U.S. Cl.
USPC .............................. 257/4; 257/359
(58) Field of Classification Search
USPC ................. 257/4, 359, 380; 438/238
See application file for complete search history.

(56) References Cited

U.S. PATENT DOCUMENTS

| | | | | |
|---|---|---|---|---|
| 5,352,923 A | * | 10/1994 | Boyd et al. | 257/536 |
| 6,096,591 A | * | 8/2000 | Gardner et al. | 438/238 |
| 7,084,483 B2 | * | 8/2006 | Aitken et al. | 257/536 |
| 7,323,751 B2 | * | 1/2008 | Beach et al. | 257/359 |

FOREIGN PATENT DOCUMENTS

| KR | 1020120121171 | 11/2012 |
|---|---|---|
| KR | 1020130074358 | 7/2013 |

* cited by examiner

*Primary Examiner* — Roy Potter
(74) *Attorney, Agent, or Firm* — IP & T Group LLP

(57) ABSTRACT

Disclosed is a semiconductor device and a method of manufacturing the same. The semiconductor device includes first material layers and second material layers alternately stacked on a first conductive layer. Through holes, each through holes including a first through region, second through region and trench, wherein the first and second through regions pass through the first and second material layers, and the trench is formed in the first conductive layer to connect the first through region and the second through region. Resistive layers, each resistive layer including a first region are disposed in the first through region, a second region disposed in the second through region, and a third region disposed in the trench.

14 Claims, 8 Drawing Sheets

SEMICONDUCTOR DEVICE AND METHOD OF MANUFACTURING THE SAME

CROSS-REFERENCE TO RELATED APPLICATION

This application is based on and claims priority from Korean Patent Application No. 10-2012-0139755, filed on Dec. 4, 2012, with the Korean Intellectual Property Office, the disclosure of which is incorporated herein in its entirety by reference.

BACKGROUND

1. Field

The present invention relates to a semiconductor device and a method of manufacturing the same, and more particularly, to a semiconductor device including resistors and a method of manufacturing the same.

2. Discussion of Related Art

A semiconductor device uses a resistor in a circuit for applying or controlling an operation voltage of the semiconductor device in order to generate a desired level of bias. In general, the resistor is formed by using a gate layer, such as a word line. The gate layer may be formed of various conductive materials in order to improve resistance. When the resistor is formed by using the gate layer, there is a difficulty in that the resistor has a necessary resistance value.

For example, there is a case where the resistance value of the resistor needs to be maintained to be larger than that of the gate layer even though the gate layer is formed of a conductive material having low resistance. In this case, in order to form the resistance value of the resistor to be larger than that of the gate layer, there is a method of increasing a length of the resistor in a 2D plane. In this case, an area occupied by the resistor is increased within a substrate, which thus may be a reason of deteriorating high integration of the semiconductor device.

SUMMARY

An exemplary semiconductor device includes first material layers and second material layers alternately stacked on a first conductive layer; through holes, each through hole including a first through region, second through region, and a trench, wherein the first and second through regions pass through the first and second material layers, and the trench is formed in the first conductive layer to connect the first and second through regions; and resistive layers, each resistive layer including a first region disposed in the first through region, a second region disposed in the second through region, and a third region disposed in the trench.

An exemplary method of manufacturing a semiconductor device includes forming a conductive layer on a resistor region of a substrate including a cell array region and the resistor region; forming trenches by etching the conductive layer; forming sacrificial layers in the trenches; alternately stacking first material layers and second material layers on the conductive layer and the sacrificial layer; forming first through regions and second through regions through the first material layers and the second material layers to expose the sacrificial layers; removing the sacrificial layers; and forming resistive layers, each resistive layer including a first region disposed, a second region and a third region, wherein the first region is disposed in each of the first through regions, a second region is disposed in each of the second through regions, and a third region is disposed in each of the trenches.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
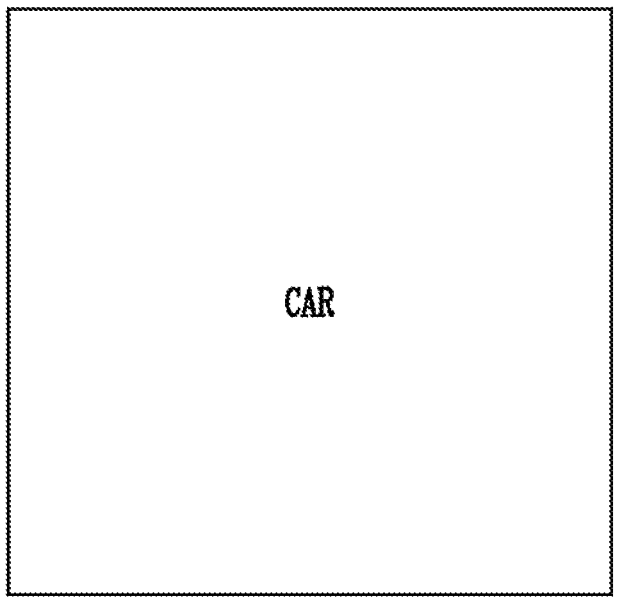
FIG. 1 is a diagram for describing an exemplary semiconductor device.
Figure 1:
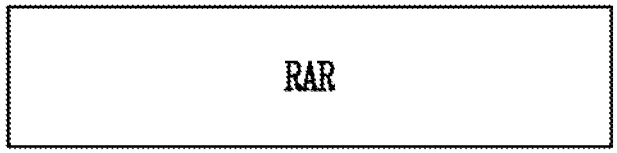

FIG. 1 is a diagram for describing an exemplary semiconductor device.

Referring to FIG. 1, an exemplary semiconductor device includes a cell array region CAR and a resistor region RAR. In addition, although it is not illustrated in the drawing, the exemplary semiconductor device may further include a decoding circuit region, a page buffer region, a capacitor region, and the like.

Cell strings are formed in the cell array region CAR. An example of the cell string formed in the cell array region CAR will be described below with reference to FIG. 2.

A resistor for distributing voltages or protecting an element is formed in the resistor region RAR. The resistor formed in the resistor region RAR includes a resistive layer having the same material as a channel structure formed in the cell array region CAR. Accordingly, the exemplary resistor may prevent a change in a resistance value of the resistor according to a change in a material for forming word lines. The exemplary resistor, and a method of manufacturing the same, will be described below with reference to FIGS. 3A to 5.

Figure 2:
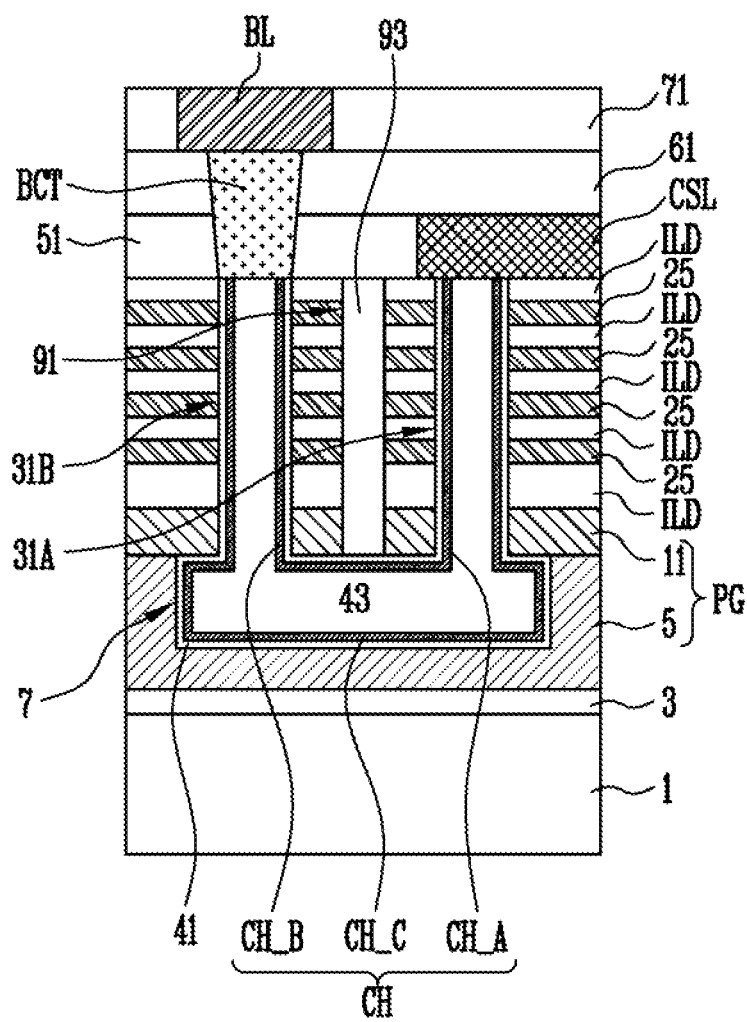
FIG. 2 is a diagram for describing an exemplary cell string.

FIG. 2 is a diagram for describing an exemplary cell string.

Referring to FIG. 2, the cell string may be formed in a U-shape along a channel structure CH. The channel structure CH includes first and second channel layers CH_A and CH_B, extending higher than an upper portion of a substrate 1, and a pipe channel layer CH_C coupling the first and second channel layers CH_A and CH_B. The pipe channel layer CH_C is disposed in a pipe trench 7 formed in a pipe gate PG. A first interlayer insulation layer 3 is formed between the pipe gate PG and the substrate 1.

The first and second channel layers CH_A and CH_B are disposed in first and second channel holes 31A and 31B, which pass through second interlayer insulation patterns ILD and conductive patterns 25, which are alternately stacked on the pipe gate PG. Accordingly, the first and second channel layers CH_A and CH_B are surrounded by the second interlayer insulation patterns ILD and the conductive patterns 25.

The pipe gate PG may include a conductive layer 5 for a first pipe gate surrounding sidewalls and a bottom surface of the pipe channel layer CH_C, and a conductive layer 11 for a second pipe gate covering an upper surface of the pipe channel layer CH_C. If the pipe gate PG includes the conductive layer 11 for the second pipe gate, then the first and second channel holes 31A and 31B, and the first and second channel layers CH_A and CH_B, may pass through the conductive layer 11 for the second pipe gate.

A slit 91 passes through the second interlayer insulation patterns ILD and the conductive patterns 25, which are between the first and second channel layers CH_A and CH_B. Accordingly, the second interlayer insulation patterns ILD and the conductive patterns 25 may be divided into a portion surrounding the first channel layer CH_A and a portion surrounding the second channel layer CH_B. The first insulation layer 93 is formed in the slit 91.

At least one layer of uppermost conductive patterns, among the conductive patterns 25, may be used as select lines, and lower conductive patterns may be used as word lines. A select line surrounding the first channel layer CH_A may be used as a source select line, and a select line surrounding the second channel layer CH_B may be used as a drain select line. A layer where a select line is formed and a layer where a word line is formed may have the same or different thicknesses. In the drawing, a case where four layers of the conductive patterns 25 are formed is described as an example, and the number of stacks of the conductive patterns 25 may be variously changed according to the number of stacks of the word lines and the number of stacks of the select lines.

A thin film 41 is formed along an interface between the pipe channel layer CH_C and the pipe trench 7, an interface between the first channel hole 31A and the first channel layer CH_A, and an interface between the second channel hole 31B and the second channel layer CH_B. The thin film 41 may include at least one of a charge blocking layer, a date storage layer, and a tunnel insulation layer. The charge blocking layer has a purpose of preventing charges from moving toward the word line, and may be formed of an oxide layer or a high dielectric layer having a high dielectric constant higher than that of a silicon oxide layer. The date storage layer may be formed of a nitride layer in which a charge may be trapped. The tunnel insulation layer may be formed of an oxide layer. A part of the thin film 41 adjacent to the select line and the pipe gate PG may be used as a gate insulation layer.

The channel structure CH may be formed along inner surfaces of the pipe trench 7, the first channel hole 31A, and the second channel hole 31B so that the channel structure CH may be formed in a tubular shape manner having an open central portion or in a pillar shape manner having a central portion completely filled. When the channel structure CH is formed in the tubular shape, the central portion of the tubular shape may be filled with a second insulation layer 43. The channel structure CH may be formed of a semiconductor layer, such as a polysilicon layer.

A pipe transistor is defined in a crossing portion of the pipe channel layer CH_C and the pipe gate PG. Memory cells are defined in a crossing portion of the first and second channel layers CH_A and CH_B and the conductive patterns for the word line, a source select transistor is defined in a crossing portion of the first channel layer CH_A and the conductive pattern for the select line, and a drain select transistor is defined in a crossing portion of the second channel layer CH_B and the select line. Accordingly, the cell string including the three-dimensionally arranged memory cells is formed on the substrate 1.

Third to fifth interlayer insulation layers 51, 61, and 71 are formed on the second interlayer insulation patterns ILD and the conductive patterns 25. The first channel layer CH_A may be connected to a common source line CSL passing through a third interlayer insulation layer 51, and the second channel layer CH_B may be connected to a bit line contact plug BCT passing through third and fourth interlayer insulation layers 51 and 61. The bit line contact plug BCT may be connected to a bit line BL passing through the fifth interlayer insulation layer 71.

The exemplary resistor includes a resistive layer having the same structure as that of the channel structure CH.

FIGS. 3A to 3D are diagrams for describing an exemplary resistor, and a method of manufacturing the same. Especially, FIGS. 3A to 3D are diagrams illustrated based on the resistor region.

Figure 3A:
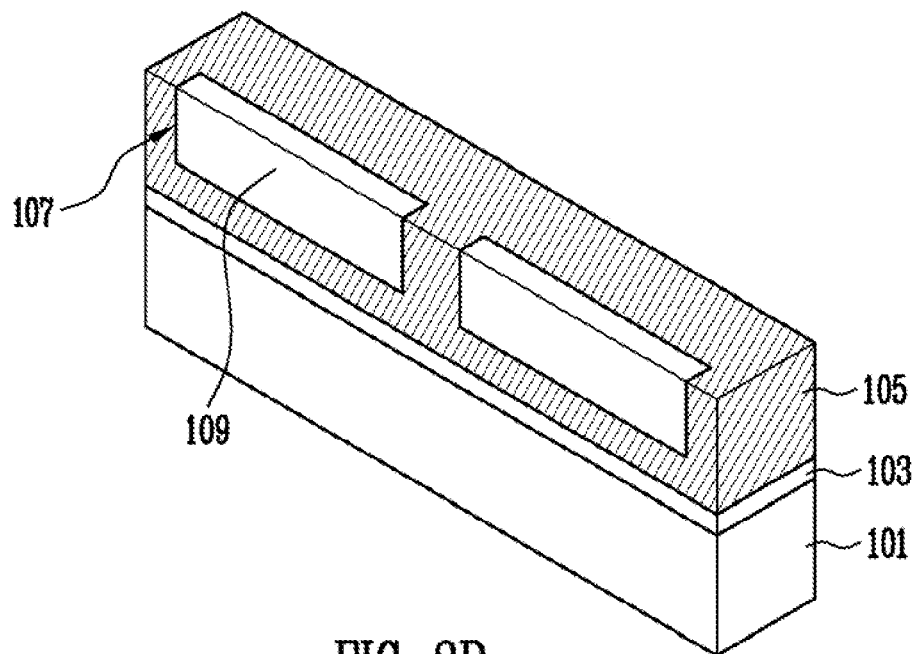
FIGS. 3A to 3D are diagrams for describing an exemplary resistor, and a method of manufacturing the same.

Referring to FIG. 3A, a first interlayer insulation layer 103 and a first conductive layer 105 are sequentially formed on a substrate 101 in the resistor region RAR. The first conductive layer 105 may be a conductive layer for a first pipe gate used as a gate surrounding sidewalls and a bottom surface of a pipe channel layer in a cell array region CAR (e.g., see FIG. 2).

Then, trenches 107 are formed by etching the first conductive layer 105. A process of forming trenches 107 and a process of forming a pipe trench in the conductive layer for the pipe gate of the cell array region CAR may be simultaneously performed.

Next, sacrificial layers 109 are formed in the trenches 107. In this case, the pipe trench of the cell array region CAR may also be filled with the sacrificial layer.

Figure 3B:
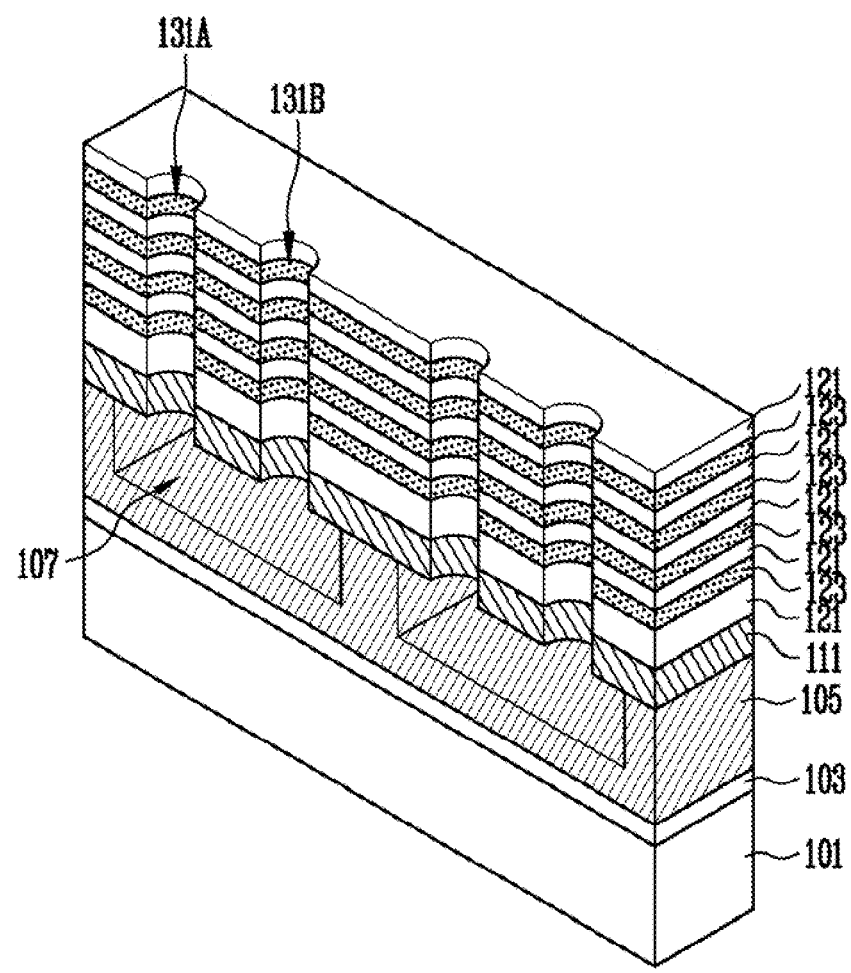

Referring to FIG. 3B, a second conductive layer 111 may be formed on the first conductive layer 105 and the trenches 107 that are filled with the sacrificial layer 109. The second conductive layer 111 may be a conductive layer for a second pipe gate, and is used as a gate covering an upper surface of the pipe channel layer of the cell array region CAR (e.g., see FIG. 2).

Next, first material layers 121 and second material layers 123 are alternately stacked on the second conductive layer 111 and the sacrificial layers 109. The first material layers 121 and the second material layers 123 are further formed in the cell array region CAR. The first material layers 121 may be formed in substantially the same planes as the second interlayer insulation patterns ILD (e.g., see FIG. 2). The second material layers 123 may be formed in substantially the same planes as the conductive patterns 25 (e.g., see FIG. 2).

The first material layers 121 and the second material layers 123 may be formed of a material layer having different etch selectivities. For example, the first material layers 121 may be formed of oxide layers that serve as the interlayer insulation layers, and the second material layers 123 may be formed of conductive layers, such as polysilicon layer, a metal layer, or a metal silicide layer. Alternatively, the first material layers 121 may be formed of oxide layers that serve as the interlayer insulation layers, and the second material layers 123 may be formed of nitride layers that serve as the sacrificial layers. Alternatively, the first material layers 121 may be formed of an undoped polysilicon that serve as the sacrificial layers, and the second material layers 123 may be formed of doped polysilicon layers that serve as the word lines or the select line.

Next, a pair of first and second through regions 131A and 131B, which are connected to a corresponding trench of the trenches 107, are formed by etching the first material layers 121 and the second material layers 123. Accordingly, the sacrificial layers 109 in the trenches 107 are exposed. The first and second through regions 131A and 131B may be formed in the resistor region RAR at the same time as the first and second channel holes 31A and 31B (e.g., see FIG. 2) are formed in the cell array region CAR. Then, the trenches 107 are opened by removing the sacrificial layers 109. As a result, through holes, each of which includes the first through region 131A, the second through region 131B and a trench 107 are formed.

Figure 3C:
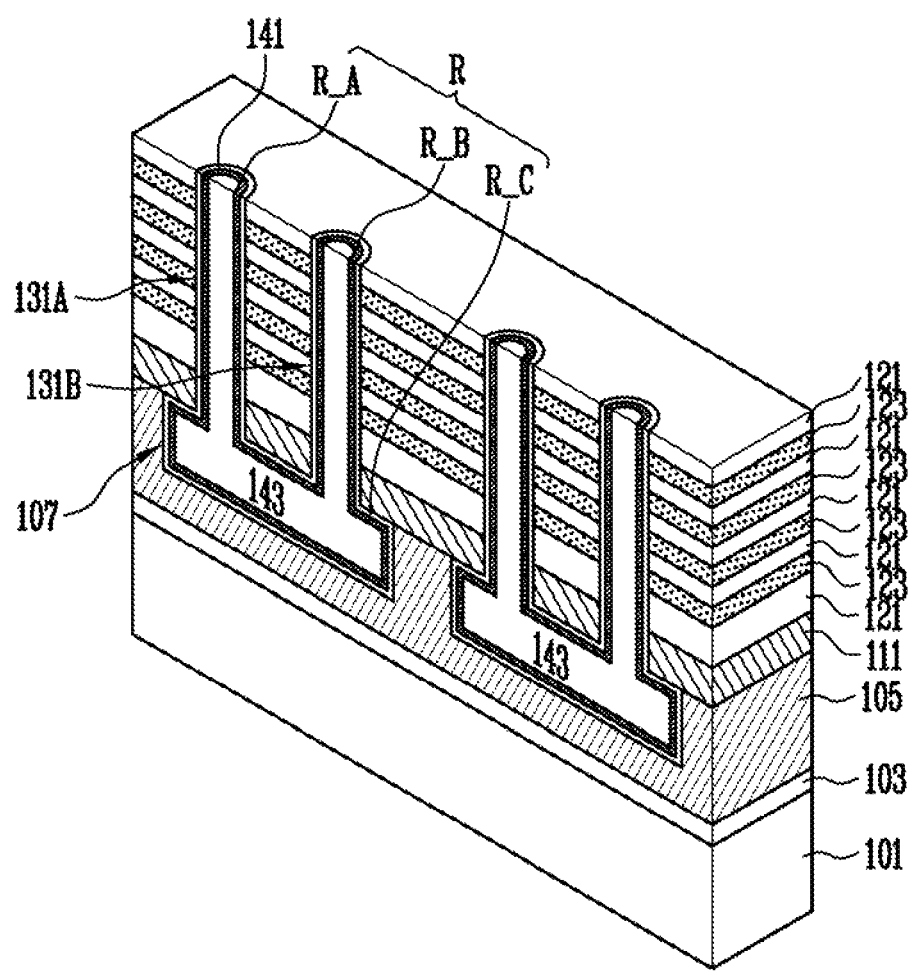

Referring to FIG. 3C, at least one layer of thin film 141 is formed on each of surfaces defining the through holes in the resistor region RAR. The thin film 141 may include at least one of a charge blocking layer, a date storage layer, and a tunnel insulation layer. The thin film 141 may be further formed on surfaces defining the first and second channel holes and the pipe trench in the cell array region CAR. The thin film 141 formed in the resistor region RAR may serve to isolate a resistive layer R (to be subsequently formed) from the first and second material layers 121 and 123 and the first and second conductive layers 105 and 111.

Subsequently, the resistive layer R is formed in the through hole in which the thin film 141 is formed. In this case, a channel structure CH (e.g., see FIG. 2) may be formed in the cell array region CAR. The resistive layer R may be formed by forming a polysilicon layer that will be the channel layer along a surface of a through hole including the trench 107, the first through region 131A, and the second through region 131B. An insulation material 143 is then formed in the through hole. The resistive layer R formed by the aforementioned process includes a first region R_A formed along a surface defining the first through region 131A and surrounding the Insulation layer 143, a second region R_B defining a surface of the second through region 131B and surrounding the insulation material 143, and a third region R_C defining a surface of the trench 107 and surrounding the insulation material 143.

Alternatively, the resistive layer R may be formed by completely filling the through hole, which includes the trench 107, the first through region 131A, and the second through region 131B, with a polysilicon layer.

Although it is not illustrated in the drawing, in the cell array region CAR, various subsequent processes may be further performed according to a composition of the first and second material layers 121 and 123 after forming a channel structure CH.

For example, if the first material layers 121 are formed of oxide layers that serve as the interlayer insulation layers, and the second material layers 123 are formed of conductive layers, then a slit 91 (e.g., see FIG. 2) for isolating the first material layers 121 and the second material layers 123, in the cell array region for each memory block or for each line, may be formed by a mask process and an etching process. Accordingly, interlayer insulation patterns formed of the first material layers 121 may be formed in the cell array region CAR, and conductive patterns for the word lines and the select lines formed of the second material layers 123 may be formed in the cell array region CAR.

Alternatively if, when the first material layers 121 are formed of oxide layers that serve as the interlayer insulation layers, and the second material layers 123 are formed of nitride layers that serve as the sacrificial layers, then the slit 91 may be formed in the cell array region CAR. The second material layers 123, exposed through the slit 91, may then be removed through a selective etching process. Accordingly, conductive layer trenches may be formed in regions in which the second material layers 123 are removed. Then, the conductive patterns for the word lines and the select lines may be formed by forming a conductive material in the conductive layer trenches. The slit 91 and the conductive layer trenches may not be formed in the resistor region RAR, and the second material layers 123, which serve as the sacrificial layers, and which may be formed of a different material than a material of the conductive patterns, are not removed from the resistor region RAR. Alternatively, the slit 91 and the conductive layer trenches may be formed in the resistor region RAR, and the second material layers 123, which serve as the sacrificial layers in the resistor region RAR, may be substituted with a conductive material.

Alternatively, if the first material layers 121 are formed of an undoped polysilicon layer that serve as the sacrificial layers, and the second material layers 123 are formed of a doped polysilicon layer, then the slit 91 may be formed in the cell array region CAR, and the first material layers 121, which are exposed through the slit 91, may be removed by a selective etching process. Accordingly, insulation layer trenches may be formed in regions in which the first material layers 121 are removed. Then, an insulation material that serves as the Interlayer insulation layers is formed in the insulation layer trenches. Accordingly, the Interlayer insulation patterns are formed in the cell array region CAR. The slit 91 and the insulation layer trenches may not be formed in the resistor region RAR, and the first material layers 121, which serve as the sacrificial layers, may be formed of a different material from the material of the interlayer insulation patterns of the cell array region CAR, and may not removed from the resistor region RAR. Alternatively, the slit 91 and the insulation layer trenches may be formed in the resistor region RAR, and the first material layers 121, which serve as the sacrificial layers of the resistor region RAR, may be substituted with the insulation material for the interlayer insulation layer.

A cell string is formed in the cell array region CAR through the aforementioned various processes, and a resistor structure is formed in the resistor region RAR.

Figure 3D:
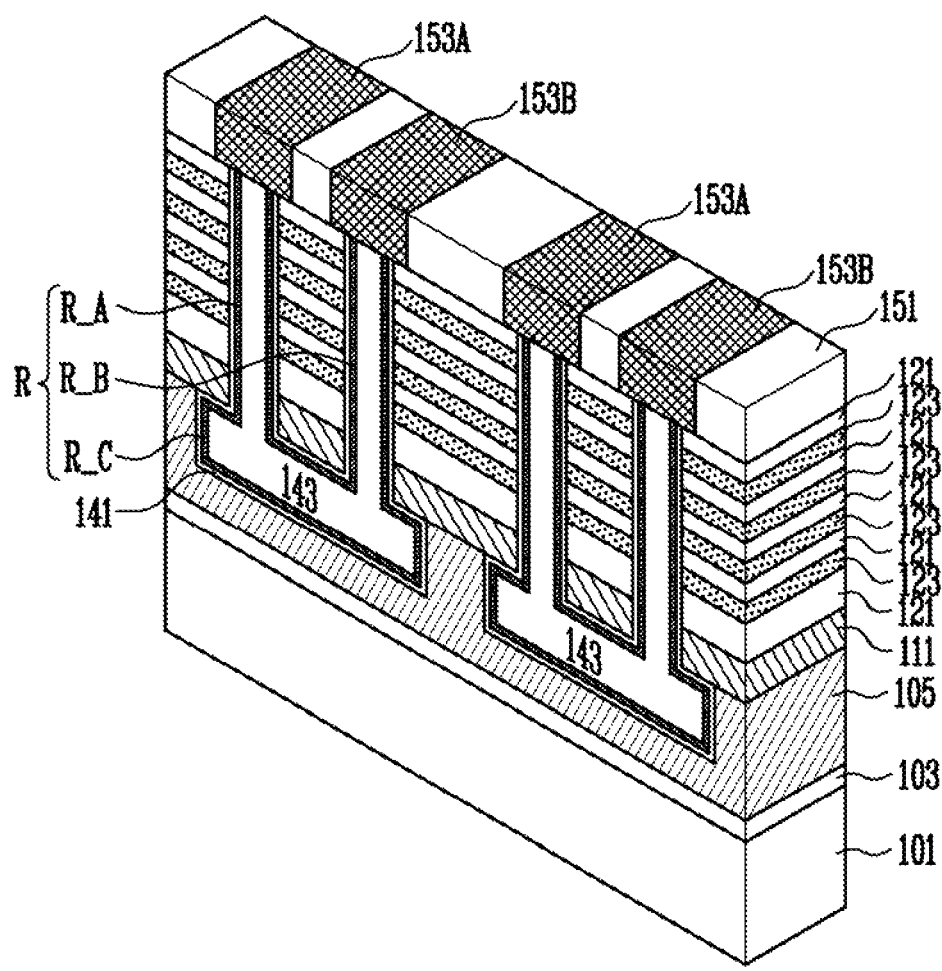

Referring to FIG. 3D, a first pad pattern 153A, which is connected to the first region R_A of the resistive layer R, and a second pad pattern 153B, which is connected to the second region R_B of the resistive layer R, are formed on an entire structure in which the resistive layer R is formed. The first and second pad patterns 153A and 153B may be connected to an external device or to a peripheral circuit (not shown in the drawing). More particularly, the first pad pattern 153A may be used as an input terminal or may be connected to an input terminal. The second pad pattern 153B may be used as an output terminal or may be connected to an output terminal.

The first and second pad patterns 153A and 153B may be formed by forming a third interlayer insulation layer 151, forming pad recess portions, in which the first and second pad patterns 153A and 153B are to be formed, by etching the third interlayer insulation layer 151, and then forming a conductive material in the pad recess portions.

As described above, the resistive layer R has the same form as that of the channel structure of the 3D semiconductor device formed in the cell array region CAR. Accordingly, even though the conductive layers for the word lines, formed in the cell array region CAR, may be formed of a metal layer or a metal silicide layer having a lower resistance than that of a polysilicon layer, a resistance of the resistive layer R is not decreased. Further, the resistive layer R may be formed in a 3D structure including the first to third regions R_A, R_B, and R_C. As a result, an area occupied by the resistive layer R in the substrate 101 may be decreased.

Figure 4:
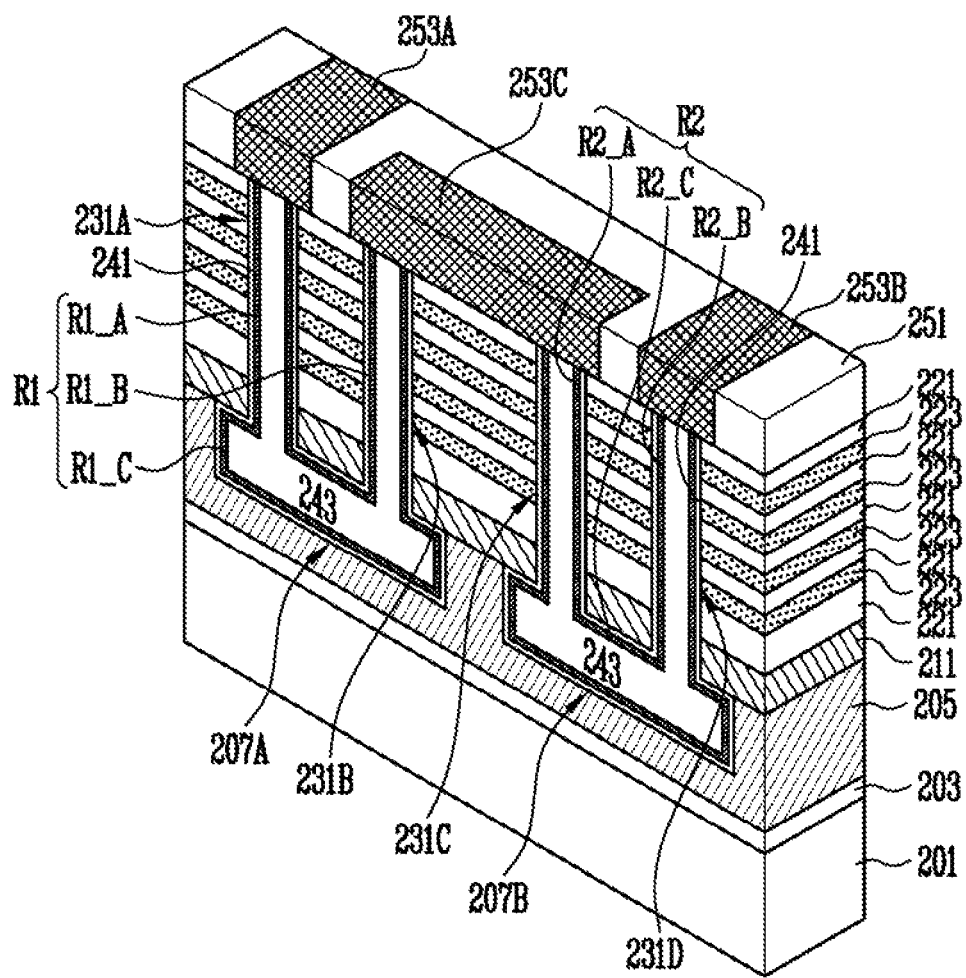
FIG. 4 is a diagram for describing an exemplary resistor, and a method of manufacturing the same.

FIG. 4 is a diagram for describing an exemplary semiconductor device, including an exemplary resistor, and a method of manufacturing the same.

Referring to FIG. 4, an exemplary semiconductor device includes a first interlayer insulation layer 203 formed on a substrate 201, a first conductive layer 205 formed on a first interlayer insulation layer 203, a second conductive layer 211 formed on the first conductive layer 205, and first and second material layers 221 and 223 alternately stacked on the second conductive layer 211.

Further, the exemplary semiconductor device includes first and second trenches 207A and 207B formed in the first conductive layer 205, first and second through regions 231A and 231B connected to the first trench 207A by passing through the first and second material layers 221 and 223, and third and fourth through regions 231C and 231D connected to the second trench 207B by passing through the first and second material layers 221 and 223. At least one layer of thin film 241 is formed on a surface defining a first through hole, which includes the first trench 207A and the first and second through regions 231A and 231B, and on a surface defining a second through hole, which includes the second trench 207B and the third and fourth through regions 231C and 231D. A first resistive layer R1 is formed in the first through hole, in which the thin film 241 is formed, and a second resistive layer R2 is formed in the second through hole, in which the thin film 241 is formed.

The first and second resistive layers R1 and R2 may be formed along surfaces defining the first and second through holes, so that each of the first and second resistive layers R1 and R2 may have a tubular shape having an open central portion or may have a pillar shape manner having a central portion completely filled. When the first and second resistive layers R1 and R2 are formed in tubular shape. An insulation material 243 may be formed in central portions of the first and second through holes.

A third interlayer insulation layer 251 is formed on the first and second material layers 221 and 223. The third interlayer insulation layer 251 is passed through by a first pad pattern 253A, a conductive pattern 253C, and a second pad pattern 253B. The first pad pattern 253A may be connected to a first region R1_A of the first resistive layer R1, and the second pad pattern 253B may be connected to a second region R2_B of the second resistive layer R2. The second region R1_B of the first resistive layer R1 and the first region R2_A of the second resistive layer R2, which are adjacent to each other, may be connected by the conductive pattern 253C.

In the exemplary resistor, the first and second resistive layers R1 and R2 are connected in series by the conductive pattern 253C. However, in an alternative implementation, the resistor may have various resistance values by connecting three or more resistive layers in series. In this example, the three or more resistive layers are connected in series. For example, one of the three or more resistive layers may be connected to the first pad pattern 253A, another resistive layer may be connected to the second pad pattern 253B, and the rest of the three or more resistive layers may be connected in series between the one and the another resistive layers through the conductive pattern 253C.

In the exemplary resistor structure, the conductive pattern 253C is simultaneously formed with the first and second pad patterns 253A and 253B.

Figure 5:
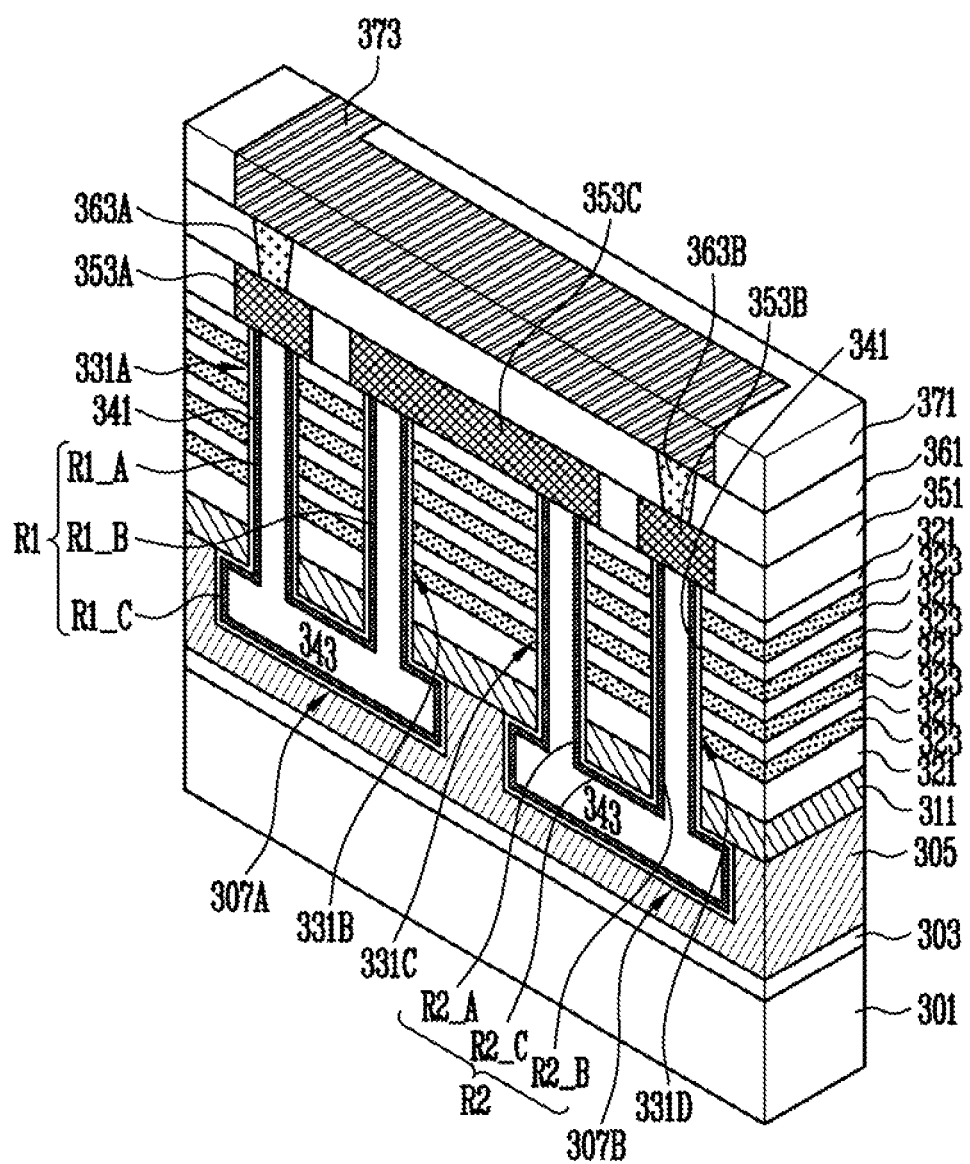
FIG. 5 is a diagram for describing an exemplary resistor, and a method of manufacturing the same.

FIG. 5 is a diagram for describing a semiconductor device, including an exemplary resistor, and a method of manufacturing the same.

Referring to FIG. 5, the exemplary semiconductor device includes a first interlayer insulation layer 303 formed on a substrate 301, a first conductive layer 305 formed on the first interlayer insulation layer 303, a second conductive layer 311 formed on the first conductive layer 305, and first and second material layers 321 and 323 alternately stacked on the second conductive layer 311.

Further, the exemplary semiconductor device includes first and second trenches 307A and 307B formed in the first conductive layer 305, first and second through regions 331A and 331B, which are connected to the first trench 307A by passing through the first and second material layers 321 and 323, and third and fourth through regions 331C and 331D connected to the second trench 307B by passing through the first and second material layers 321 and 323. At least one layer of thin film 341 is formed on a surface defining a first through hole, which includes the first trench 307A and the first and second through regions 331A and 331B, and is formed on a surface defining a second through hole, which includes the second trench 307B and the third and fourth through regions 331C and 331D. The first resistive layer R1 is formed in the first through hole, in which the thin film 341 is formed, and the second resistive layer R2 is formed in the second through hole, in which the thin film 341 is formed.

The first and second resistive layers R1 and R2 may be formed along surfaces defining the first and second through holes, so that each of the first and second resistive layers R1 and R2 may have a tubular shape having an open central portion or may have a pillar shape having a central portion that is completely filled with a polysilicon layer. If the first and second resistive layers R1 and R2 are formed in tubular shape, then an insulation material 343 may be formed in the a central portions of the first and second through holes.

A third interlayer insulation layer 351 is formed on the first and second material layers 321 and 323. First and second contact plugs 353A and 353B and a first pad pattern 353C pass through the third interlayer insulation layer 351. The first contact plug 353A may be connected to a first region R1_A of the first resistor R1, and the second contact plug 353B may be connected to a second region R2_B of a second resistor R2. The first pad pattern 353C may be commonly connected to the second region R1_B of the first resistive layer R1 and the first region R2_A of the second resistive layer R2 that are adjacent to each other. The first and second contact plugs 353A and 353B and the first pad pattern 353C may be formed by forming contact holes, in which the first and second contact plugs 353A and 353B are to be formed, and a pad recess portion, in which the first pad pattern 353C is to be formed, by etching the third interlayer insulation layer 351, and then forming a conductive material infilling the contact holes and the pad recess portion with a conductive material.

A fourth interlayer insulation layer 361 is formed on the third interlayer insulation layer 351, which includes the first and second contact plugs 353A and 353B and the first pad pattern 353C. The third and fourth contact plugs 363A and 363B pass through the fourth interlayer insulation layer 361. The third contact plug 363A is connected to the first contact plug 353A, and the fourth contact plug 363B is connected to the second contact plug 353B. The third and fourth contact plugs 363A and 363B may be formed by forming the contact holes, in which the third and fourth contact plugs 363A and 363B are to be formed, by etching the fourth interlayer insulation layer 361, and then forming a conductive material in filling the contact holes with a conductive material.

A fifth interlayer insulation layer 371 is formed on the fourth interlayer insulation layer 371, which includes the third and fourth contact plugs 363A and 363B. A second pad pattern 373 passes through the fifth interlayer insulation layer 371. The second pad pattern 373 is commonly connected to the third and fourth contact plugs 363A and 363B. Accordingly, the second pad pattern 373 is commonly connected to the first and second resistive layers R1 and R2 via the first to fourth contact plugs 353A, 353A, 353B, 363A, and 353B. The second pad pattern 373 may be formed by forming a pad recess portion, in which the second pad pattern 373 is to be formed, by etching the fifth interlayer insulation layer 371, and then forming a conductive material in the filling the pad recess portion with a conductive material.

In the exemplary resistor, the first and second resistive layers R1 and R2 are connected to the first and second pad patterns 353C and 373 in parallel. However, in an alternative implementation, the resistor may have various resistance values by connecting three or more resistive layers in parallel. In this example, each of the three or more resistive layers may include first and second regions passing through the first and second material layers and a third region connecting the first and second regions. First regions of the three or more resistive layers may be commonly connected to the first pad pattern. Second regions of the three or more resistive layers may be commonly to the second pad pattern through the contact plugs.

An exemplary resistor structure, which is formed under the third interlayer insulation layer 351, may be formed of a similar material and by a similar method, as the material and method described above with respect to FIGS. 3A to 3D.

Figure 6:
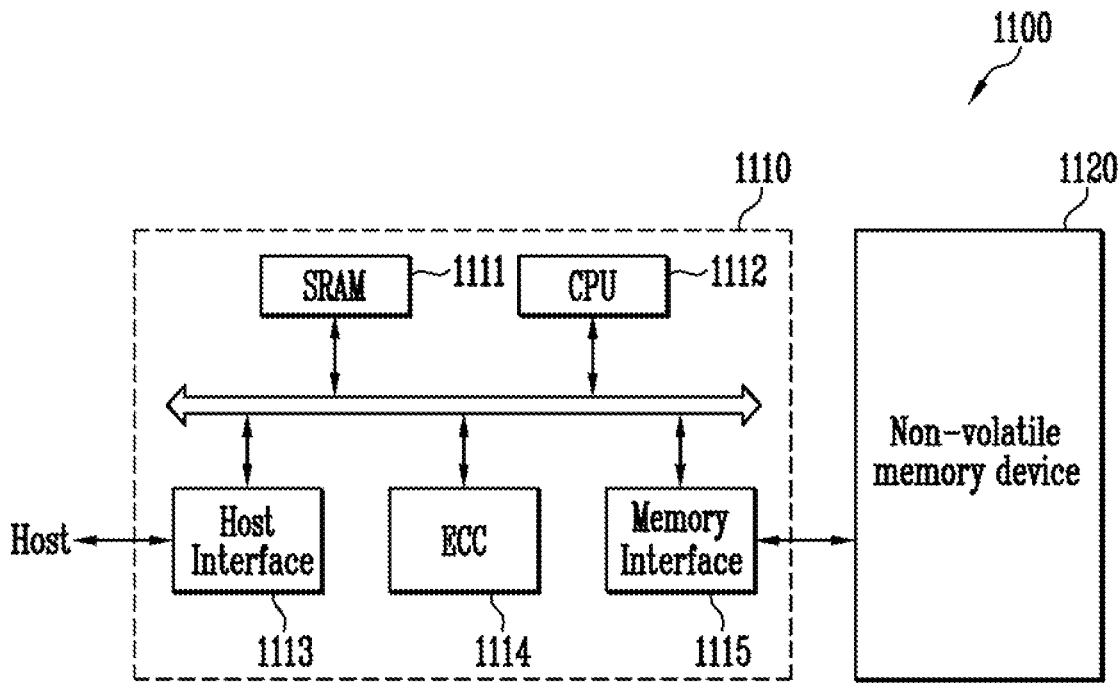
FIG. 6 is a configuration diagram illustrating an exemplary memory system.

FIG. 6 is a configuration diagram illustrating an exemplary memory system 1100 that may include an exemplary non-volatile memory device 1120 and a memory controller 1110.

The non-volatile memory device 1120 may include an exemplary semiconductor memory device, as described above with reference to FIGS. 1 to 5. Further, the exemplary non-volatile memory device 1120 may be provided as a multi-chip package including a plurality of flash memory chips.

The memory controller 1110 is configured to control the non-volatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of a host connected with the memory system 1100. Further, the ECC 1114 detects and corrects an error included in data read from the non-volatile memory device 1120, and the memory interface 1115 performs interfacing with the non-volatile memory device 1120. In addition, the memory controller 1110 may further include a ROM, or the like, for storing code data for interfacing with a host.

The memory system 1100 including the aforementioned configuration may be a memory card or a Solid State Disk (SSD) in which the non-volatile memory device 1120 is combined with the memory controller 1110. For example, when the memory system 1100 is the SSD, the memory controller 1110 may communicate with an external device (for example, a host) through one among various interface protocols, such as USB, MMC, PCI-E, SATA, PATA, SCSI, ESDI, or IDE.

Figure 7:
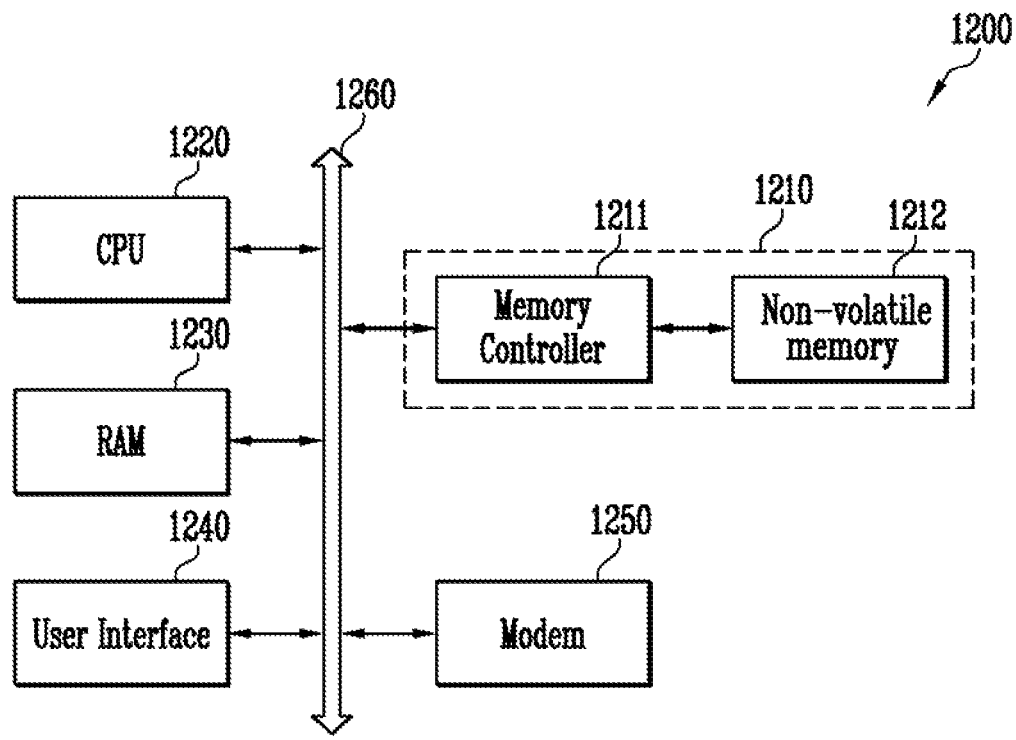
FIG. 7 is a configuration diagram illustrating an exemplary computing system.

FIG. 7 is a configuration diagram illustrating an exemplary computing system 1200 that may include a CPU 1220 electrically connected to a system bus 1260, a RAM 1230, a user interface 1240, a modem 1250, and a memory system 1210. Further, when the computing system 1200 is a mobile device, the computing system 1200 may further include a battery for supplying an operating voltage to the computing system 1200, and may further include an application chip-set, a Camera Image Processor (CIS), a mobile DRAM, or the like.

The memory system 1210 may include a non-volatile memory 1212 and a memory controller 1211 as described above with reference to FIG. 6.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
    first material layers and second material layers alternately stacked on a first conductive layer;
    through holes, each through hole including a first through region, a second through region and a trench, wherein the first and second through regions pass through the first and second material layers, and the trench is formed in the first conductive layer to connect the first and second through regions; and
    resistive layers, each resistive layer including a first region disposed in the first through region, a second region disposed in the second through region, and a third region disposed in the trench.

2. The semiconductor device of claim 1, further comprising:
    a first pad pattern connected to the first region of each of the resistive layers; and
    a second pad pattern connected to the second region of each of the resistive layers.

3. The semiconductor device of claim 1, further comprising:
    a first pad pattern connected to a first resistive layer among the resistive layers;
    a second pad pattern connected to a second resistive layer among the resistive layers; and
    a conductive pattern connecting the first resistive layer and the second resistive layer in series.

4. The semiconductor device of claim 1, further comprising:
    a first pad pattern connected to the second region of a first resistive layer among the resistive layers and the first region of a second resistive layer among the resistive layers; and
    a second pad pattern connected to the first region of the first resistive layer and the second region of the second resistive layer.

5. The semiconductor device of claim 1, further comprising:
    interlayer insulation patterns formed in substantially the same planes as the first material layers;
    third conductive patterns formed in substantially the same planes as the second material layers;
    a first channel layer and a second channel layer passing through the interlayer insulation patterns and the third conductive patterns;
    a pipe channel layer to connect the first and second channel layers; and
    a pipe gate to surround the pipe channel layer.

6. The semiconductor device of claim 5, wherein the interlayer insulation patterns are formed of the same material as that of the first material layers.

7. The semiconductor device of claim 5, wherein the third conductive patterns are formed of the same material as that of the second material layers.

8. The semiconductor device of claim 5, wherein the interlayer insulation patterns are formed of a different material than that of the first material layers.

9. The semiconductor device of claim 5, wherein the third conductive patterns are formed of a different material than that of the second material layers.

10. The semiconductor device of claim 1, further comprising:
   a thin film formed along an interface between each of the resistive layers and each of the through holes.

11. The semiconductor device of claim 10, wherein the thin film includes at least one of a charge blocking layer, a data storage layer, and a tunnel insulation layer.

12. The semiconductor device of claim 1, wherein each of the resistive layers fills each of the through holes.

13. The semiconductor device of claim 1, wherein each of the resistive layers is formed along a surface defining each of the through holes so that each of the resistive layers has a tubular shape with an open central portion.

14. The semiconductor device of claim 1, further comprising:
   a fourth conductive layer formed on the first conductive layer.

* * * * *